United States Patent
Floyd et al.

[11] Patent Number: 6,160,713
[45] Date of Patent: Dec. 12, 2000

[54] CIRCUIT IN A SELECTIVE CALL RADIO WITH IMPROVED ELECTROMECHANICAL INTERCONNECTS

[75] Inventors: Michael Richard Floyd, Dacula, Ga.; Thomas A. Oberle, Boca Raton; Patrick Joseph Prayne, Boynton Beach, both of Fla.

[73] Assignee: Motorola, Inc., Schaumburg, Ill.

[21] Appl. No.: 09/216,770

[22] Filed: Dec. 21, 1998

[51] Int. Cl.⁷ .................................................. H05K 1/18
[52] U.S. Cl. ...................... 361/760; 361/748; 361/749; 361/764; 174/254; 174/260; 174/262; 257/734; 257/737; 257/735
[58] Field of Search .................................... 361/760, 748, 361/749, 764, 765, 766, 767; 174/250, 254, 256, 260, 262; 257/734, 737, 738

[56] References Cited

U.S. PATENT DOCUMENTS

| | | |
|---|---|---|
| 4,814,943 | 3/1989 | Okuaki .................................. 361/783 |
| 5,180,976 | 1/1993 | Van Loan et al. ...................... 324/158 |
| 5,519,332 | 5/1996 | Wood et al. ............................ 324/755 |
| 5,640,047 | 6/1997 | Nakashima ............................. 257/738 |
| 5,777,855 | 7/1998 | Yokajty ................................. 361/803 |
| 6,000,120 | 12/1999 | Arledge et al. .......................... 29/600 |
| 6,002,163 | 12/1999 | Wojnarowski .......................... 257/620 |
| 6,002,590 | 12/1999 | Farnworth et al. ..................... 361/749 |
| 6,061,246 | 5/2000 | Oh et al. ................................ 361/749 |
| 6,079,100 | 6/2000 | Farquhar et al. ......................... 29/852 |

*Primary Examiner*—Jeffrey Gaffin
*Assistant Examiner*—David Foster
*Attorney, Agent, or Firm*—Randi L. Dulaney

[57] ABSTRACT

A SCR (Selective Call Radio) (400) includes a circuit. The circuit in turn includes a component (102) having one or more bondable elements (104–108), and a substrate (110) coupled to the component (102). To substantially improve interconnect reliability, the substrate (110) includes a corresponding one or more bondable pads (108) for interconnecting with the one or more bondable elements (104–108) of the component (102), and one or more slotted openings (202) in the substrate (110) for relieving mechanical stress near one or more interconnects of the substrate (110) and the component (102).

10 Claims, 5 Drawing Sheets

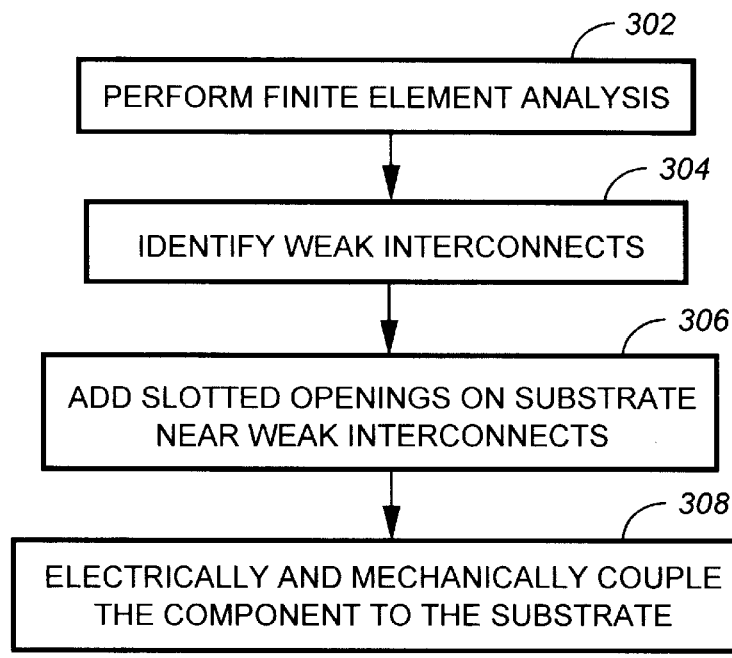
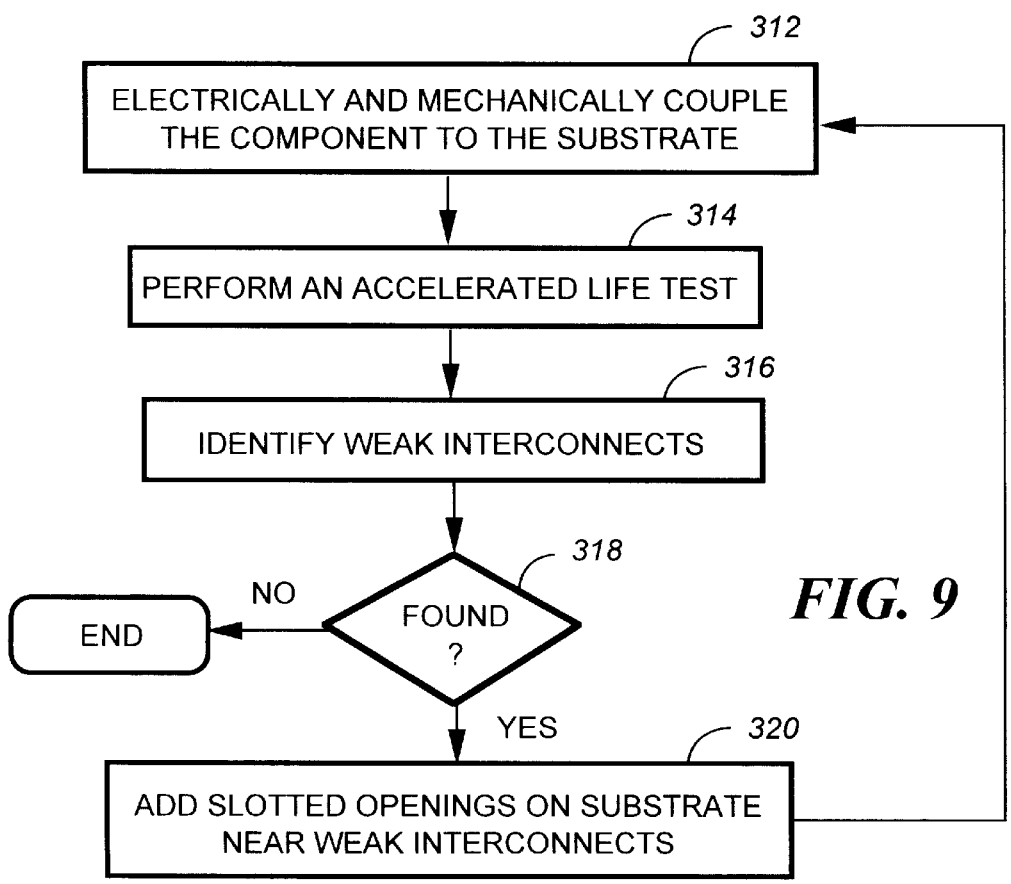
*FIG. 8*
*FIG. 9*

CIRCUIT IN A SELECTIVE CALL RADIO WITH IMPROVED ELECTROMECHANICAL INTERCONNECTS

FIELD OF THE INVENTION

This invention relates in general to selective call radios, and particularly, to a circuit in a selective call radio with improved electromechanical interconnects.

BACKGROUND OF THE INVENTION

As miniaturization continues to be an industry goal, technological advances in integrated circuit design and PCB (Printed Circuit Board) design have provided circuit engineers the ability to manufacture denser circuit boards using advanced fine-pitch interconnect technology. Examples of advanced fine-pitch interconnect technology include electrical components fabricated from BGA (Ball Grid Array) technology or DCA (Direct Chip Attach) technology, just to mention a few. To employ fine-pitch technology, however, manufacturers have had to improve PCB substrates as well. An example of such an improvement is HDI (High Density Interconnect) technology.

These advances have given rise to new challenges—principally, in the area of interconnect reliability as measured under average to extreme environmental conditions. FIGS. 1–5 illustrate how present manufacturing technologies in board and IC design have created reliability issues not yet solved in the present art. FIG. 1 depicts the interconnect between a conventional BGA component 102 and a conventional PCB substrate 110. The BGA component 102 includes one or more bondable elements shown as the combination of a stud 104 coupled to a solder bump 106. During the manufacturing process, the bondable elements are aligned with a corresponding set of bondable pads 108 on the PCB 110, which provide electrical interconnect to other components by way of conventional vias and runners connected thereto. FIG. 2 illustrates the PCB 110 and BGA 102 after both have been subjected to, for example, a conventional reflow process.

FIGS. 3–4 show perspective views of the PCB 110 and the bondable pads 106 before and after the PCB 110 is subjected to forces generally encountered in the field as a matter of consumer use. As FIG. 3 illustrates, before any forces are applied to the PCB 110, the surface of the PCB 110 is relatively flat. Under these environmental conditions, interconnects consisting of the bondable pads 106 and the bondable elements (not directly shown in FIGS. 3–4) are free from stress. FIG. 4 illustrates what happens when one or more forces representative of a predetermined maximum stress (e.g., forces encountered during a drop test) are applied to a circuit carried by the PCB 110. Note that although this figure illustrates uniformly distributed forces applied on a side of the PCB 110, it will be appreciated that realistically during a drop test, or like stress test, such forces are distributed non-uniformly throughout the PCB 110. In FIG. 4, the highest stress points are found in corners of the array of bondable pads 108. The bondable pads 108 in the corners tend to encounter more stress because their position on the PCB 110 subjects them to multidirectional forces 112, 114, which the other pads are not subject to.

With fine-pitch technology such as BGA, the dimension of the solder bump 106 is substantially reduced to accommodate the high density of interconnects. As a result of the smaller dimension, the strength of the interconnect between the solder bump 106 and the bondable pads 108 is substantially reduced when compared to older interconnect technologies using larger dimensions. As a result of a weak bond, interconnects are vulnerable to electromechanical disconnect such as, for example, fractures 118 as shown in FIG. 5. Although the bondable pads 108 nearest the stress forces shown in FIG. 4 may result in fractures, the corner pads 108 have a higher likelihood of fracturing because of the multidirectional forces 112–114 these pads encounter.

Presently, this deficiency in the prior art has produced field failures in portable selective call radios such as, for example, cellular phones, and pagers, which are often subjected to harsh environments. Accordingly, a need exists for a method that improves the reliability of electromechanical interconnects in selective call radios utilizing advanced PCB interconnect technologies.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

FIGS. 8–9 depict flowcharts representative of alternative embodiments for overcoming interconnect reliability issues in the prior art according to the present invention;

DESCRIPTION OF THE PREFERRED EMBODIMENT

Figure 6:
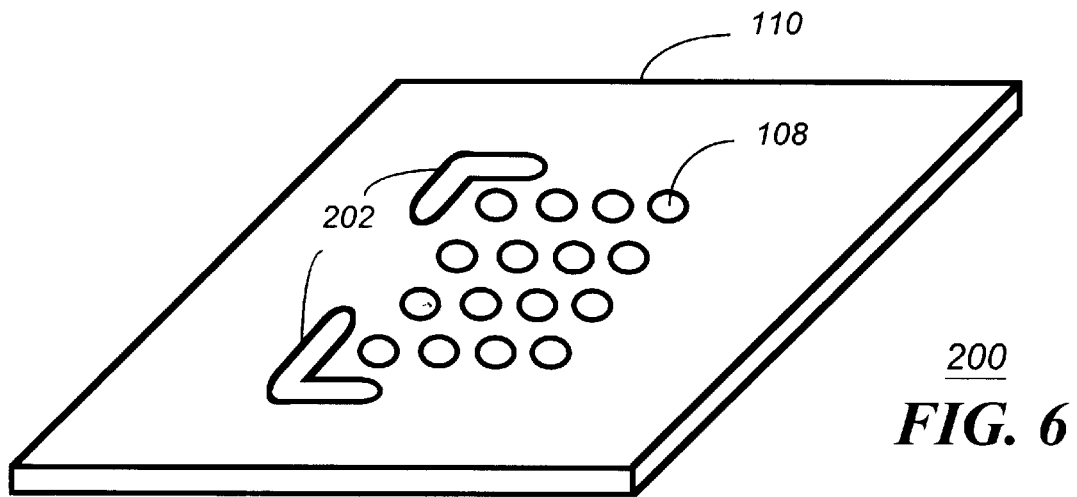
FIGS. 6–7 show perspective views of the PCB with the addition of slotted openings before and after the PCB is subjected to forces generally encountered in the field according to the present invention.
Figure 7:
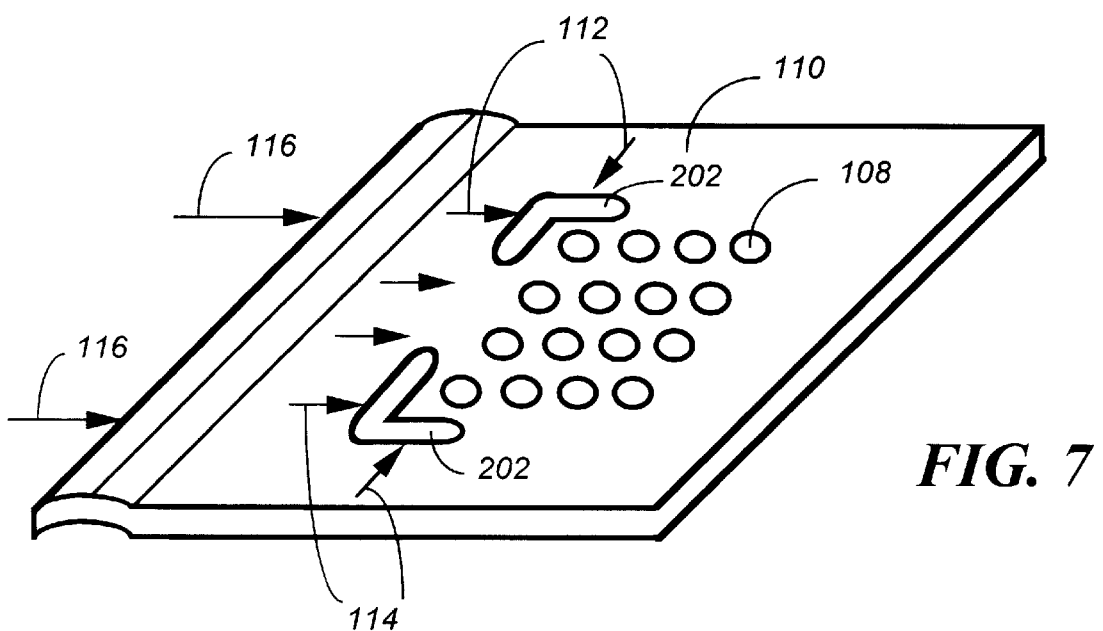

FIGS. 6–7 show perspective views of the PCB 110 with the addition of slotted openings 202 before and after the PCB 110 is subjected to forces generally encountered in the field according to the present invention. As shown, the slotted openings 202 are L-shaped surrounding the bondable pads 108 at the corners. The use of L-shaped slotted openings 202 helps to isolate the bondable pads 108 at the corners from stresses resulting from, for example, a drop test. It will be appreciated that the shape of the slotted openings 202 is not critical to the invention. Rather, it is the positioning of the slotted openings 202 that is important in producing the effect of isolating weak interconnects from commonly encountered environmental stresses.

Figure 1:
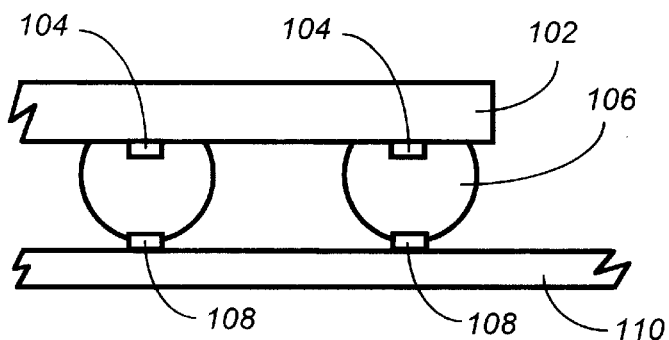
FIGS. 1–2 are electrical block diagrams of a before and after prior art interconnect between a BGA (Ball Grid Array) and a PCB (Printed Circuit Board)
Figure 2:
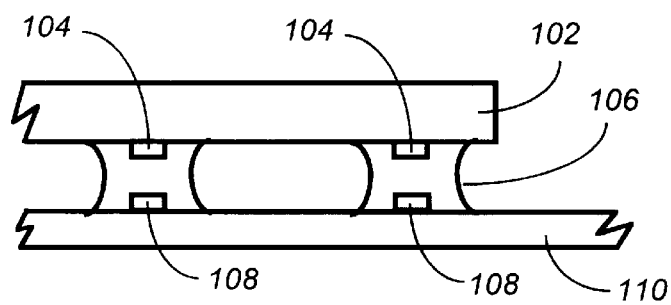
Figure 3:
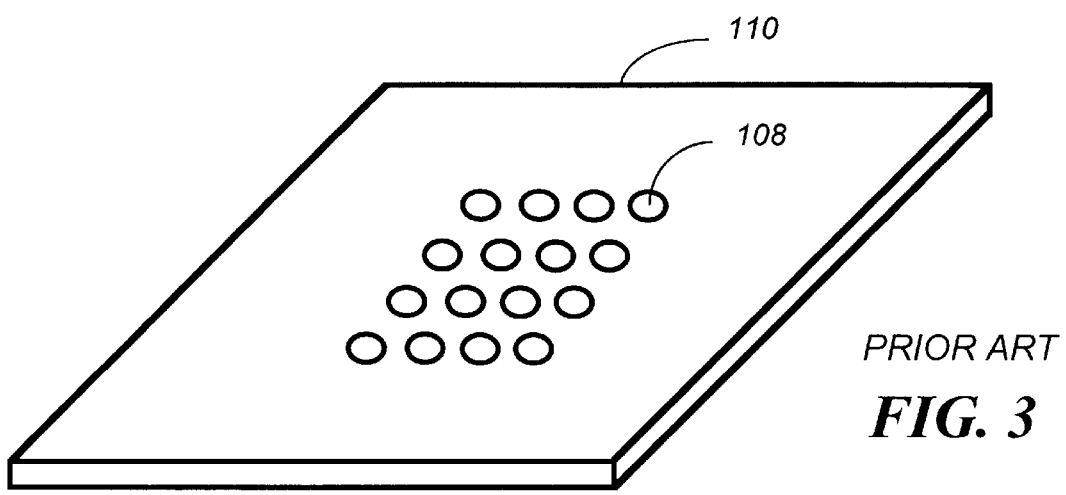
FIGS. 3–4 show perspective views of the PCB before and after the PCB is subjected to forces generally encountered in the field as a matter of consumer use.
Figure 4:
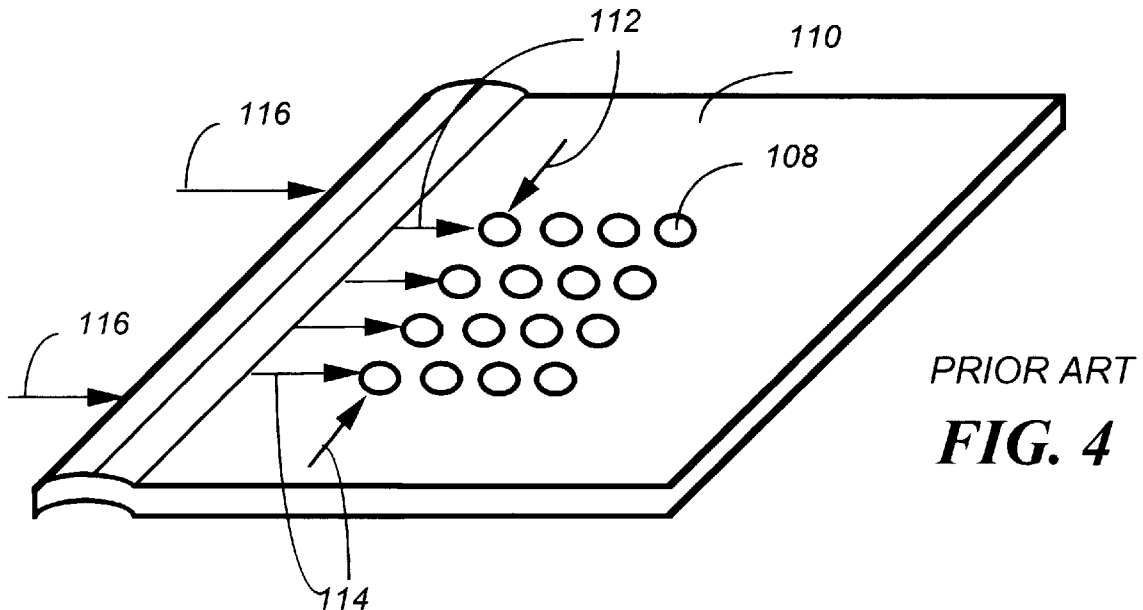
Figure 5:
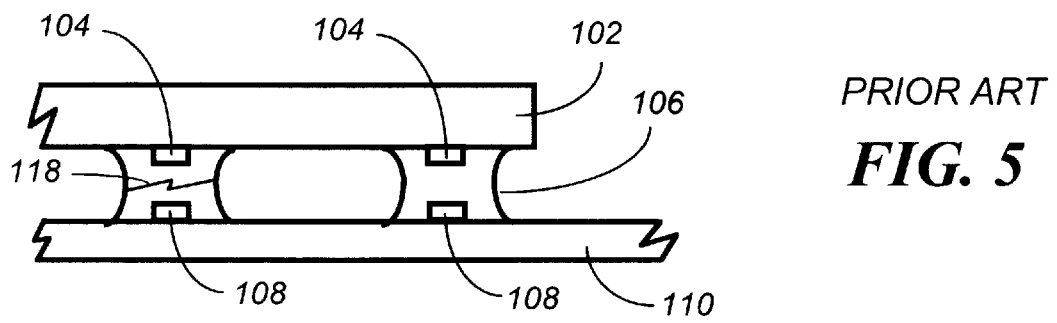
FIG. 5 illustrates reliability issues encountered in the prior art as a result of stresses applied to the PCB of FIG. 4.

As illustrated in FIG. 7, the corner pads 108 are isolated from the multidirectional forces 112–114 by way of the slotted openings 202. Consequently, the likelihood of a fracture 118 as shown in FIG. 5 is substantially eliminated, thereby improving the reliability of selective call radios manufactured with PCBs according to the present invention. It will be appreciated that this method of isolation, in accordance with the present invention, is applicable to rigid PCBs comprising, e.g., epoxy laminate, as well as, flexible PCBs comprising, e.g., polyimide material—either of which may use HDI (High Density Interconnect) technology for dense board designs. Similarly, the present invention is applicable to an array of surface mount technologies such as, for example, electrical components comprising BGA, DCA, conventional leaded components (e.g., Quad Flat Package devices—not shown), and non-electrical components comprising mechanical devices for interconnecting, for example, a PCB to a housing.

FIGS. 8–9 depict flowcharts 300 representative of alternative embodiments for implementing the present invention. The flowchart 300 of FIG. 8 depicts a first embodiment beginning at step 302. At this step, a conventional FEA (Finite Element Analysis) is performed for each of the interconnects of the BGA 102 and the PCB 110. This analysis is performed by way of a conventional FEA simulator operating from a computer that simulates a predetermined set of environmental conditions applied to the interconnects of the BGA 102 and the PCB 110. This simulation takes into account the physical characteristics of the PCB 110, the BGA 102 and the interconnects therebetween. At step 304, weak interconnects (i.e., interconnects subject to electromechanical disconnect) are identified according to the analysis results from step 302. At step 306, one or more slotted openings are added to the PCB 110 near at least one interconnect determined from the foregoing step to be subject to electromechanical disconnect. In step 308, the bondable elements of the BGA 102 and the and the bondable pads 108 of the PCB 110 are electrically and mechanically coupled to each other using conventional methods.

The present embodiment has the advantage of applying the present invention prior to the physical manufacture of a substrate and corresponding components carried thereby. Accordingly, engineering cycle time is reduced, which in turn improves the product-to-market cycle. Equally as important, the present embodiment helps to reduce manufacturing costs by reducing the number of iterations needed to introduce a quality product to marketplace. Notwithstanding the advantages of this embodiment, it will be appreciated that the same results may be derived by iteratively improving the manufacture of a combined substrate-component design.

This alternative approach is illustrated in FIG. 9. The PCB 110 and BGA 102 are electrically and mechanically coupled to each other in step 312 prior to adding slotted openings to the PCB 110. In step 314, a conventional ALT (Accelerated Life Test) is performed. These tests include the application of environmental forces simulating typical field use. In step 316 the ALT results of step 314 are analyzed to determine whether weak interconnects exist. If weak interconnects are identified in step 318, then in step 320 slotted openings are added to another PCB 110 near the weak interconnects identified. Once this is done, the modified PCB 110 is electrically and mechanically coupled by conventional means to another BGA 102 in step 312. The process is repeated until in step 318 no more weak interconnects are identified.

Figure 10:
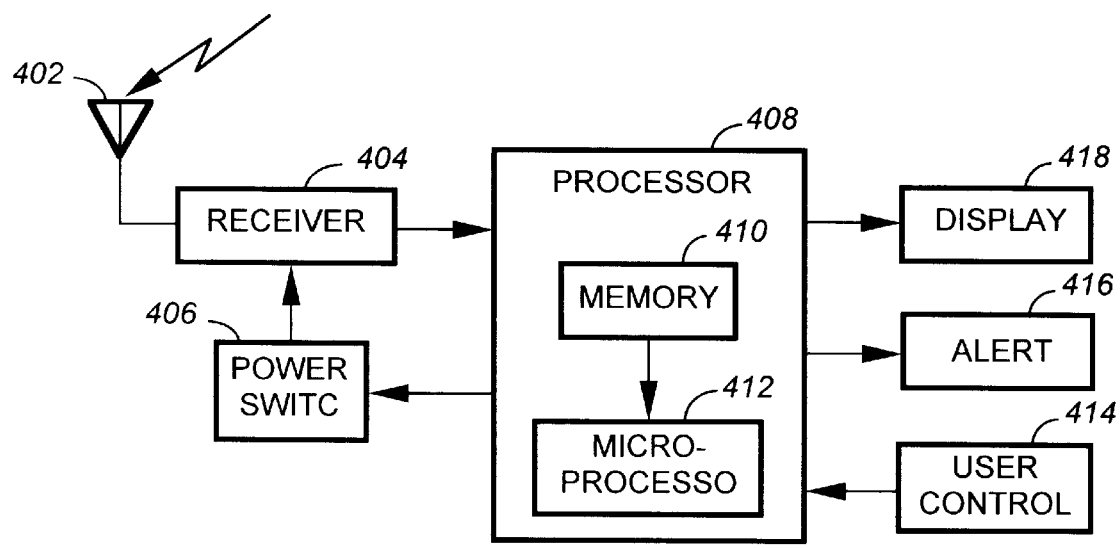
FIG. 10 shows a selective call radio utilizing the improved interconnect technology of FIGS. 6–7 for overcoming deficiencies in the prior art according to the present invention.

Either of these embodiments is helpful in improving the reliability of consumer products utilizing the aforementioned advanced substrate and component technologies. The present invention is especially important in the design of selective call radios such as pagers and cellular phones. FIG. 10 illustrates a SCR 400 (Selective Call Radio) with improved reliability as a result of manufacturing the circuits shown according to the present invention.

The SCR 400 comprises an antenna 402 for intercepting RF (Radio Frequency) signals from, for example, a radio communication system (not shown). The antenna 402 is coupled to a receiver 404 employing conventional demodulation techniques for receiving the communication signals transmitted by the radio communication system. Radio signals received by the receiver 404 produce demodulated information, which is coupled to a processor 408 for processing received messages. A conventional power switch 406, coupled to the processor 408, is used to control the supply of power to the receiver 404, thereby providing a battery saving function.

To perform the necessary functions of the SCR 400, the processor 408 includes a conventional microprocessor 412, and conventional memory 410 including, for example, a random access memory (RAM), a read-only memory (ROM), and an electrically erasable programmable read-only memory (EEPROM). The processor 408 is programmed by way of the ROM to process incoming messages transmitted by the radio communication system. The processor 408 decodes an address in the demodulated data of the received message, compares the decoded address with one or more addresses stored in the EEPROM, and when a match is detected, proceeds to process the remaining portion of the message. Once the processor 408 has processed the message, it stores the message in the RAM, and a call alerting signal is generated to alert a user that a message has been received. The call alerting signal is directed to a conventional audible or tactile alerting device 416 for generating an audible or tactile call alerting signal.

The message can be accessed by the user through user controls 414, which provide functions such as lock, unlock, delete, read, etc. More specifically, by the use of appropriate functions provided by the user controls 414, the message is recovered from the RAM, and conveyed to the user by way of a display 418, e.g., a conventional liquid crystal display (LCD). It will be appreciated that, additionally, the display 418 can be accompanied by an audio circuit (not shown) for conveying voice messages.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A selective call radio comprising a circuit, wherein the circuit comprises:
   a component having one or more bondable elements; and
   a substrate coupled to the component, the substrate comprising:
      a corresponding one or more bondable pads for interconnecting with the one or more bondable elements of the component; and
      one or more slotted openings in the substrate for relieving mechanical stress near one or more interconnects of the substrate and the component.

2. The selective call radio as recited in claim 1, wherein the substrate is a rigid PCB (Printed Circuit Board) comprising an epoxy laminate.

3. The selective call radio as recited in claim 1, wherein the substrate is a flexible PCB (Printed Circuit Board) comprising a polyimide material.

4. The selective call radio as recited in claim 1, wherein the substrate comprises a HDI (High Density Interconnect) PCB (Printed Circuit Board).

5. The selective call radio as recited in claim 1, wherein the component comprises a selected one of an electrical component and a non-electrical component.

6. The selective call radio as recited in claim 1, wherein the component comprises a surface mount component.

7. The selective call radio as recited in claim 6, wherein the surface mount component comprises a BGA (Ball Grid Array) component.

8. The selective call radio as recited in claim 6, wherein the surface mount component comprises a DCA (Direct Chip Attach) component.

9. The selective call radio as recited in claim 1, wherein a bondable element comprises a solder bump coupled to a stud on the component.

10. The selective call radio as recited in claim 1, wherein a bondable element comprises a lead for electrically and mechanically coupling to a bondable pad on the substrate.

* * * * *